United States Patent [19]

Rieder

[11] Patent Number: 5,530,389

[45] Date of Patent: Jun. 25, 1996

[54] CIRCUIT ARRANGEMENT FOR A CLOCK GENERATOR

[75] Inventor: Klaus-Hartwig Rieder, Stuttgart, Germany

[73] Assignee: Alcatel SEL Aktiengesellschaft, Stuttgart, Germany

[21] Appl. No.: 326,762

[22] Filed: Oct. 20, 1994

[30] Foreign Application Priority Data

Oct. 23, 1993 [DE] Germany .......................... 43 36 239.7

[51] Int. Cl.⁶ ..................................................... H03L 7/00
[52] U.S. Cl. ........................... 327/156; 327/244; 331/10; 331/49
[58] Field of Search .......................... 327/141, 144–153, 327/155–162, 231–233, 237, 241–245, 248–251; 331/10, 18, 11, 49, 50; 375/120, 371, 376

[56] References Cited

U.S. PATENT DOCUMENTS

| | | | |
|---|---|---|---|
| 3,898,579 | 8/1975 | Aldridge | 327/156 |
| 4,355,364 | 10/1982 | Gudat | 331/2 |
| 4,980,652 | 12/1990 | Tarusawa et al. | 331/10 |
| 4,980,899 | 12/1990 | Troost et al. | 375/108 |
| 5,023,572 | 6/1991 | Caldwell et al. | 331/10 |
| 5,052,028 | 9/1991 | Zwack | 375/109 |
| 5,124,670 | 6/1992 | Lawton | 331/10 |
| 5,142,247 | 8/1992 | Lada, Jr. et al. | 331/2 |
| 5,349,310 | 9/1994 | Rieder et al. | 331/18 |
| 5,371,480 | 12/1994 | Hedberg et al. | 331/18 |
| 5,414,390 | 5/1995 | Kovacs et al. | 331/2 |
| 5,434,888 | 7/1995 | Fukuchi | 331/2 |
| 5,463,351 | 10/1995 | Marko et al. | 331/50 |

FOREIGN PATENT DOCUMENTS

| | | |
|---|---|---|
| 0224884 | 6/1987 | European Pat. Off. . |
| 0347737 | 6/1989 | European Pat. Off. . |
| 0509706 | 10/1992 | European Pat. Off. . |

OTHER PUBLICATIONS

"Neue Taktgeneratoren fur EWSD", telecom report 9 (1986) Heft 4, pp. 263–269 by Ernest, W., Hartmann, H. L.

Primary Examiner—Timothy P. Callahan
Assistant Examiner—T. Lam
Attorney, Agent, or Firm—Ware, Fressola, Van Der Sluys & Adolphson

[57] ABSTRACT

To ensure error-free transmission of digital information, very stringent requirements are placed on the accuracy and stability of the clock generators. It is known to use microprocessor-controlled digital phase-locked loops for this purpose, which contain costly high-stability crystal oscillators. An accurate system clock signal is to be provided even if the reference clock signal fails. Contradictory requirements are placed on the phase-locked loops, namely, on the one hand, a wide bandwidth to achieve a small time interval error, and, on the other hand, a narrow bandwidth to minimize the effect of jitter and wander on clock accuracy if the reference clock signal should fail. The invention provides a circuit arrangement for a low-cost clock generator which generates a highly accurate clock frequency even in the event of a failure of the reference clock signal. According to the invention, the contradictory requirements placed on a phase-locked loop are divided between two phase-locked loops which are both controlled by a microprocessor and have only one fixed-frequency generator associated with them. A first phase-locked loop (1) with a narrow bandwidth is connected via a switch (3) to a second, wide-bandwidth phase-locked loop. If the reference clock signal fails, the output of the first phase-locked loop (1) will be switched as an internal reference clock to the second phase-locked loop (2).

3 Claims, 2 Drawing Sheets

5,530,389

CIRCUIT ARRANGEMENT FOR A CLOCK GENERATOR

TECHNICAL FIELD

The present invention relates to a circuit arrangement for a clock generator which is used in digital communications networks.

BACKGROUND OF THE INVENTION

To ensure error-free data transmission, very stringent requirements are placed on the accuracy and stability of such clock generators. It is known, for example, to use microprocessor-controlled digital phase-locked loops for these purposes, see Ernst, W., Hartmann, H. L., "Neue Taktgeneratoren fur EWSD", telcom report 9 (1986) Heft 4, pp. 263–269. In such clock generators, contradictory requirements are placed on the phase-locked loop. On the one hand, the bandwidth of the phase-locked loop should be as wide as possible to meet the requirements regarding the time interval error (TIE), and on the other hand, the bandwidth should be as narrow as possible to minimize the effect of jitter and wander on clock accuracy in the event of a failure of the external reference clock signal. To be able to meet these contradictory requirements, very expensive high-stability crystal oscillators are used in conventional clock generators, but with the trade-off that, particularly in the event of a failure of the reference clock, deviations of the clock frequency become effective which are due to the properties of the crystal oscillator, such as its inherent stability.

SUMMARY OF THE INVENTION

It is the object of the invention to provide a circuit arrangement for a low-cost clock generator which provides a clock signal of high frequency stability derived from and synchronous with a reference clock signal, and which is to retain its frequency with high accuracy in the event of a failure of the reference clock signal.

The gist of the invention consists in the fact that the contradictory requirements placed on a phase-locked loop are not fulfilled by one phase-locked loop, but that the clock generator includes two phase-locked loops which are each optimized for particular properties. Although two digital phase-locked loops are present, in a preferred embodiment of the invention, only one fixed-frequency generator in the form of a high-stability crystal oscillator and only one microprocessor are used. The requirements placed on the crystal oscillator used in the novel circuit are less stringent than those placed on the crystal oscillators employed in conventional clock generators, so that the cost of the circuit is reduced. The function of the first phase-locked loop is to provide a highly accurate clock signal if the external clock signal should fail. This loop therefore has a narrow bandwidth, e.g., 0.001Hz, and hence a large time interval error, which, however, is not disturbing in this circuit. The second phase-locked loop is designed to generate the system clock signal to be distributed.

This phase-locked loop has a relatively wide bandwidth, e.g., 0.1 Hz, and hence a small time interval error.

Thus, a circuit arrangement is provided which, using a crystal oscillator which is less stable and, thus, less expensive than crystal oscillators in conventional solutions, implements a clock generator of high Q and high reliability even in the event of a failure of the reference clock signal.

BRIEF DESCRIPTION OF THE DRAWINGS

The invention will become more apparent from the following description of an embodiment taken in conjunction with the accompanying drawings, in which.

BEST MODE FOR CARRYING OUT INVENTION

Figure 1:
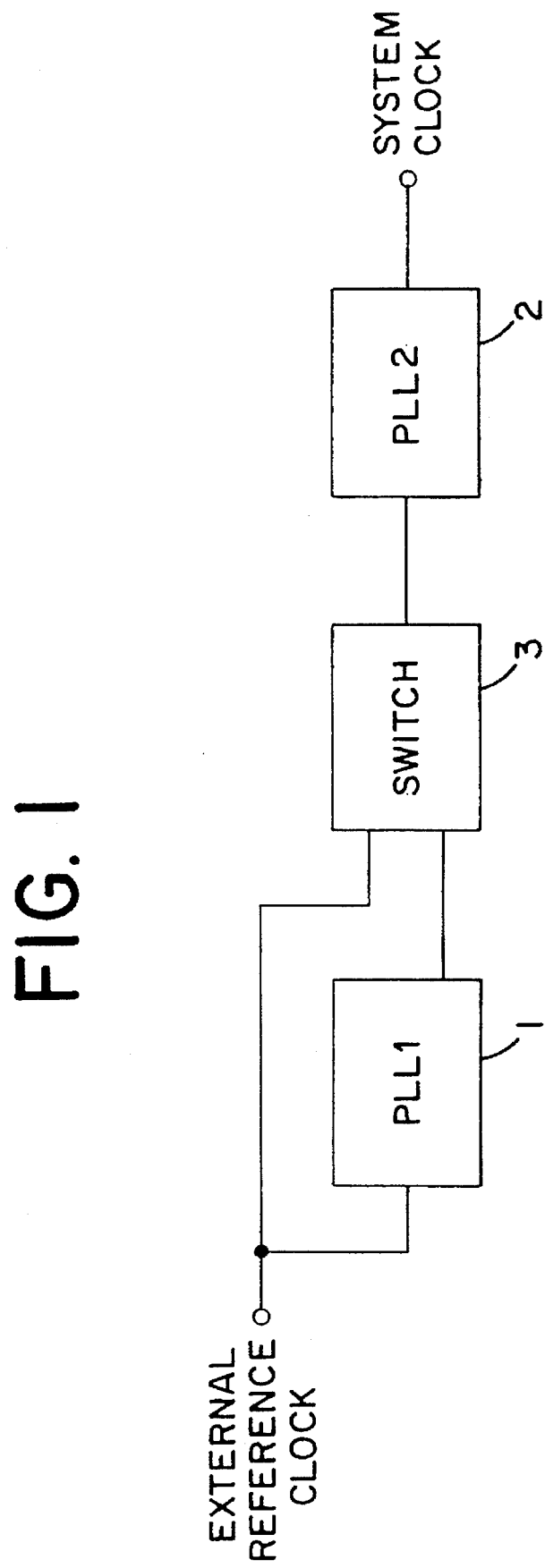
FIG. 1 is a block diagram of the circuit arrangement according to the invention.

Referring to FIG. 1, the circuit arrangement for a clock generator consists of a first phase-locked loop 1, a second phase-locked loop 2, and a switch 3. During normal operation, the respective oscillators of the first and second phase-locked loops 1, 2 are synchronized with the respective reference clock signal applied at the input. The presence of the reference clock signal is monitored by a missing-pulse detector (not shown in FIG. 1). Should the external reference clock signal fail, the missing-pulse detector will cause the switch 3 to switch from the external reference clock signal to an internal clock signal provided by the first phase-locked loop 1, which thus becomes the reference clock signal for the second phase-locked loop 2. In this manner, the first phase-locked loop 1 can advantageously be optimized in terms of the accuracy of its output frequency so as to be able to provide a highly accurate internal reference clock signal to the second phase-locked loop 2 if the external reference clock signal should fail. Jitter and wander have very little effect on the frequency accuracy of the internal reference clock signal.

The first phase-locked loop 1 is also optimized with respect to frequency monitoring the external reference clock signal. Since the phase-locked loop has a very narrow bandwidth, it follows frequency changes of the reference clock signal only very slowly. Frequency changes of the reference clock signal can thus be better detected. The second phase-locked loop has a relatively wide bandwidth and is thus optimized for a small time interval error. Moreover, it is strongly damped to keep peak jitter within predetermined limits.

Figure 2:
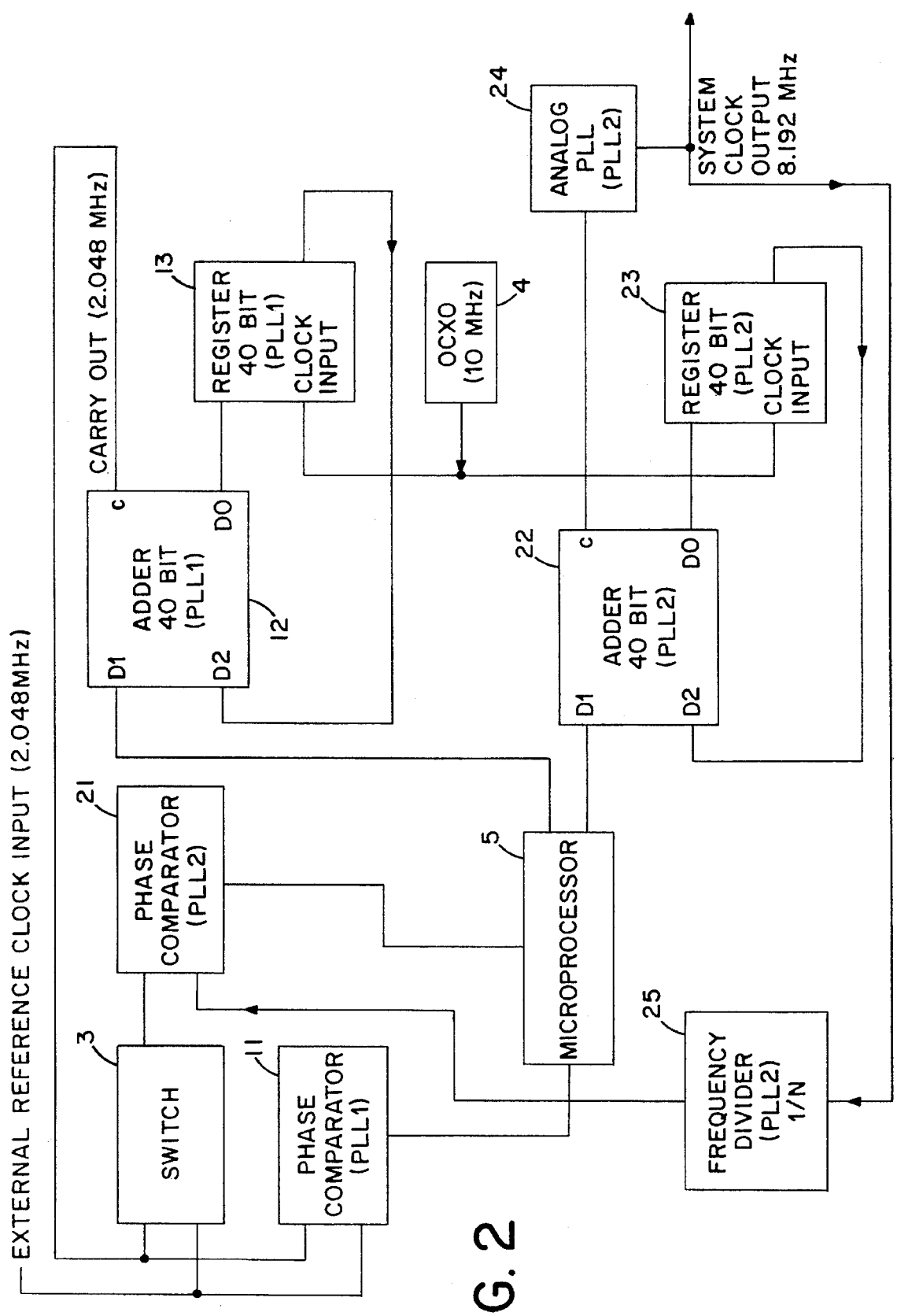
FIG. 2 is a more detailed block diagram of the circuit arrangement according to the invention.

FIG. 2 shows details of the circuit arrangement. Common to both phase-locked loops are a thermostatically stabilized fixed-frequency generator 4 and a microprocessor 5. The first phase-locked loop further comprises a phase detector 11, an adder 12, and a register 13. The second phase-locked loop contains similar modules, namely a phase detector 21, an adder 22, and a register 23 and, in addition, an analog phase-locked loop 24 of simple design with a comparatively inexpensive voltage-controlled oscillator. This analog phase-locked loop 24 is followed by a frequency divider 25. Adder 12, 22 and register 13, 23 form a variable frequency divider which is adjusted by the microprocessor 5 in very small steps. The interconnection of the microprocessor 5 with the respective adder 12, 22 and the respective register 13, 23 acts like a variable-frequency oscillator. The fixed-frequency generator 4 clocks the respective register 13, 23, whose contents are added to the digital output signal from the microprocessor 5 in the respective adder 12, 22. The carry output c of the adder 12, 22 then provides a pulse sequence whose frequency can be varied in small steps by the digital output of the microprocessor 5. Since this pulse sequence is jittery, the second phase-locked loop includes at its output end the analog phase-locked loop 24 for filtering the jitter and providing a nearly jitter-free system clock. In the present example, the analog phase-locked loop 24 also converts the generated frequency $f_1=2.048$ MHz to the frequency $f_2=8.192$ MHz, which is needed in the system. The frequency divider 25 divides the frequency of the system clock signal to the frequency of the reference clock signal. The microprocessor 5 realizes the above-described characteristic properties of the first and second phase-locked loops.

The monitoring of the external reference clock signal is not shown in FIGS. 1 and 2. It is done by means of a missing-pulse detector and/or by means of the phase detector 11 of the first phase-locked loop 1. If two or more inputs have to be monitored, each input will have one phase detector associated with it. The jitter of the first phase-locked loop 1 will not be disturbing during the frequency monitoring if phase detectors are used which take the average of the phase over a given time, e.g., over 100 ms. Instead of the numerically controlled variable-frequency oscillators shown in FIG. 2, other designs can be used. If a facility in a digital communications network is to be operated without an external reference clock signal over a prolonged period of time, it is expedient, for reliability reasons, to use more than two crystal oscillators in a duplicated clock system. Then, in case of frequency deviations, the deviating oscillator can be found by a majority decision. In that case, the first and second phase-locked loops can be operated with separate thermostatically stabilized crystal oscillators.

What is claimed is:

1. A circuit arrangement for a clock generator that generates a system clock signal in digital communications networks whose output is compared in frequency and phase with a reference clock signal, characterized in that a first phase-locked loop (1) is connected via a switch (3) to a second phase-locked loop (2), that during normal operation, the reference clock signal is applied directly to the first phase-locked loop (1) and is applied to the second phase-locked loop (2) through the switch (3), that the second phase-locked loop generates the system clock signal from the reference clock signal when the reference clock signal is applied to it by the switch, wherein the first phase-locked loop has a narrow bandwidth as compared to the second phase-locked loop so that the output of the first phase-locked loop slowly follows the frequency changes of the reference clock signal and thereby represents the average frequency of the reference clock signal and that in the event of a failure of the reference clock signal, the switch (3) is caused to apply, instead of the reference clock signal, the output of the first phase-locked loop (1) that represents the average frequency of the reference clock signal to the second phase-locked loop (2), which in turn provides the system clock signal based upon the output of the first phase-locked loop.

2. A circuit arrangement for a clock generator as claimed in claim 1, characterized in that the first and second phase-locked loops each comprise a phase detector (11, 21) and a variable-frequency oscillator which consists of a fixed-frequency generator (4) associated with both phase-locked loops and succeeded in each phase-locked loop by a register (13, 23) and an adder (12, 22), said variable-frequency oscillator being microprocessor-controlled in dependence upon the output signal from the respective phase detector (11, 21), and that the output of the phase detector (11) of the first phase-locked loop and the output of the phase comparator (21) of the second phase-locked loop are connected to a microprocessor (5) which, in turn, is connected to the adders (12, 22) in the first and second phase-locked loops.

3. A circuit arrangement for a clock generator as claimed in claim 2, characterized in that the adder (22) of the second phase-locked loop is succeeded by an analog phase-locked loop (24) for filtering jitter.

* * * * *